United States Patent
Wang et al.

(10) Patent No.: US 7,394,260 B2
(45) Date of Patent: Jul. 1, 2008

(54) TUNING A TEST TRACE CONFIGURED FOR CAPACITIVE COUPLING TO SIGNAL TRACES

(75) Inventors: Margaret H. Wang, Sunnyvale, CA (US); Prabhansu Chakrabarti, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 83 days.

(21) Appl. No.: 11/440,383

(22) Filed: May 24, 2006

(65) Prior Publication Data
US 2007/0273386 A1    Nov. 29, 2007

(51) Int. Cl.
G01R 31/02    (2006.01)
G01R 31/04    (2006.01)
G01R 27/26    (2006.01)
(52) U.S. Cl. .................... 324/537; 324/538; 324/686
(58) Field of Classification Search ................. 324/537, 324/538, 686
See application file for complete search history.

(56) References Cited

U.S. PATENT DOCUMENTS

| | | | |
|---|---|---|---|
| 5,363,048 A | 11/1994 | Modlin et al. | |
| 5,486,753 A | 1/1996 | Khazam et al. | |
| 6,104,198 A | 8/2000 | Brooks | |
| 6,868,021 B2 * | 3/2005 | Tanabe et al. | 365/200 |
| 6,933,730 B2 | 8/2005 | Parker et al. | |
| 6,960,917 B2 | 11/2005 | Parker et al. | |
| 6,984,991 B2 * | 1/2006 | Bond et al. | 324/538 |
| 7,012,811 B1 | 3/2006 | Jiang et al. | |
| 7,075,307 B1 | 7/2006 | Williamson | |
| 2004/0164755 A1 * | 8/2004 | Yamaoka et al. | 324/754 |

(Continued)

FOREIGN PATENT DOCUMENTS

EP    0 805 356    11/1997

(Continued)

OTHER PUBLICATIONS

Cangellaris et al., "Interactive Tutorial on Fundamentals of Signal Integrity for High-Speed/High Density Design," Design Automation Conference, 2001.

*Primary Examiner*—Andrew H Hirshfeld
*Assistant Examiner*—Timothy J Dole
(74) *Attorney, Agent, or Firm*—Robert C. Kowert; Anthony M. Petro; Meyertons, Hood, Kivlin, Kowert & Goetzel, P.C.

(57) ABSTRACT

A method of tuning a test trace that is capacitively coupled to a number of signal traces. A method for determining a configuration of a device comprising signal traces and a capacitively coupled test trace may include selecting a test frequency of a test signal to be driven on selected signal traces during a test mode of device operation, and tuning circuit characteristics of the test trace to generate a bandpass frequency response including a passband and a stopband, where a detection frequency corresponding either to the test frequency or a selected harmonic of the test frequency is included in the passband. Tuning of circuit characteristics may include selecting a degree of capacitive coupling between the test trace and the signal traces such that, within a specified constraint for signal degradation on the signal traces, the bandpass frequency response of the given test trace satisfies a specified transmission requirement at the detection frequency.

20 Claims, 6 Drawing Sheets

U.S. PATENT DOCUMENTS

| | | | |
|---|---|---|---|
| 2004/0227527 A1* | 11/2004 | Bortesi et al. | 324/676 |
| 2006/0095817 A1* | 5/2006 | Lee et al. | 714/719 |
| 2007/0115004 A1* | 5/2007 | Mirov et al. | 324/538 |

FOREIGN PATENT DOCUMENTS

| | | |
|---|---|---|
| GB | 2143954 | 2/1985 |
| GB | 2 405 215 | 2/2005 |
| JP | 2001201753 | 7/2001 |
| WO | 02/082109 | 10/2002 |
| WO | 2004/025315 | 3/2004 |

\* cited by examiner

TUNING A TEST TRACE CONFIGURED FOR CAPACITIVE COUPLING TO SIGNAL TRACES

BACKGROUND OF THE INVENTION

1. Field of the Invention

This invention relates to test techniques for high-bandwidth circuits and, more particularly, to tuning of test traces that are capacitively coupled to signal traces.

2. Description of the Related Art

High-bandwidth interconnects, such as serializer/deserializer (serdes) interconnects, are becoming increasingly common in the design of computing systems. For example, serdes interconnects may be used in place of parallel interconnects to reduce interconnect pin count while preserving high rates of data transfer. Such interconnects may be employed to interface distinct portions of a single system component, such as a single integrated circuit, or to interface different components within a system, such as peripherals, processors, memory devices or other types of components.

As high-bandwidth interconnects proliferate, it is increasingly important to ensure that such interconnects operate reliably in the face of many possible failure modes, such as may be induced by component manufacturing defects, system assembly flaws, or operational failures. One aspect of reliability assurance includes providing an effective test methodology for detecting interconnect faults. However, owing to the sensitivity of many high-bandwidth interconnect designs, testing of such interconnects may need to be minimally invasive in order to avoid perturbing the normal operating characteristics of the interconnect. In turn, minimally invasive test techniques may be particularly susceptible to noise, making it especially difficult to design a test methodology that is reliable in detecting faults and minimally degrades the normal operating performance of the interconnects being tested.

SUMMARY

Various embodiments of methods of tuning a test trace that is capacitively coupled to a number of signal traces are disclosed. According to one embodiment, a method for determining a configuration of a device comprising a number of signal traces and one or more test traces configured to capacitively couple to the signal traces may include selecting a test frequency of a test signal to be driven on selected ones of the signal traces during a test mode of operation of the device, and tuning one or more circuit characteristics of a given one of the one or more test traces to generate a bandpass frequency response of the given test trace including a passband and a stopband, where a detection frequency corresponding either to the test frequency or a selected harmonic of the test frequency is included in the passband. Tuning of circuit characteristics of the given test trace may include selecting a degree of capacitive coupling between the given test trace and each of multiple ones of the signal traces such that, within a specified constraint for signal degradation on the multiple ones of the signal traces, the bandpass frequency response of the given test trace satisfies a specified transmission requirement at the detection frequency.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Overview of System Including Test Traces

Figure 1:
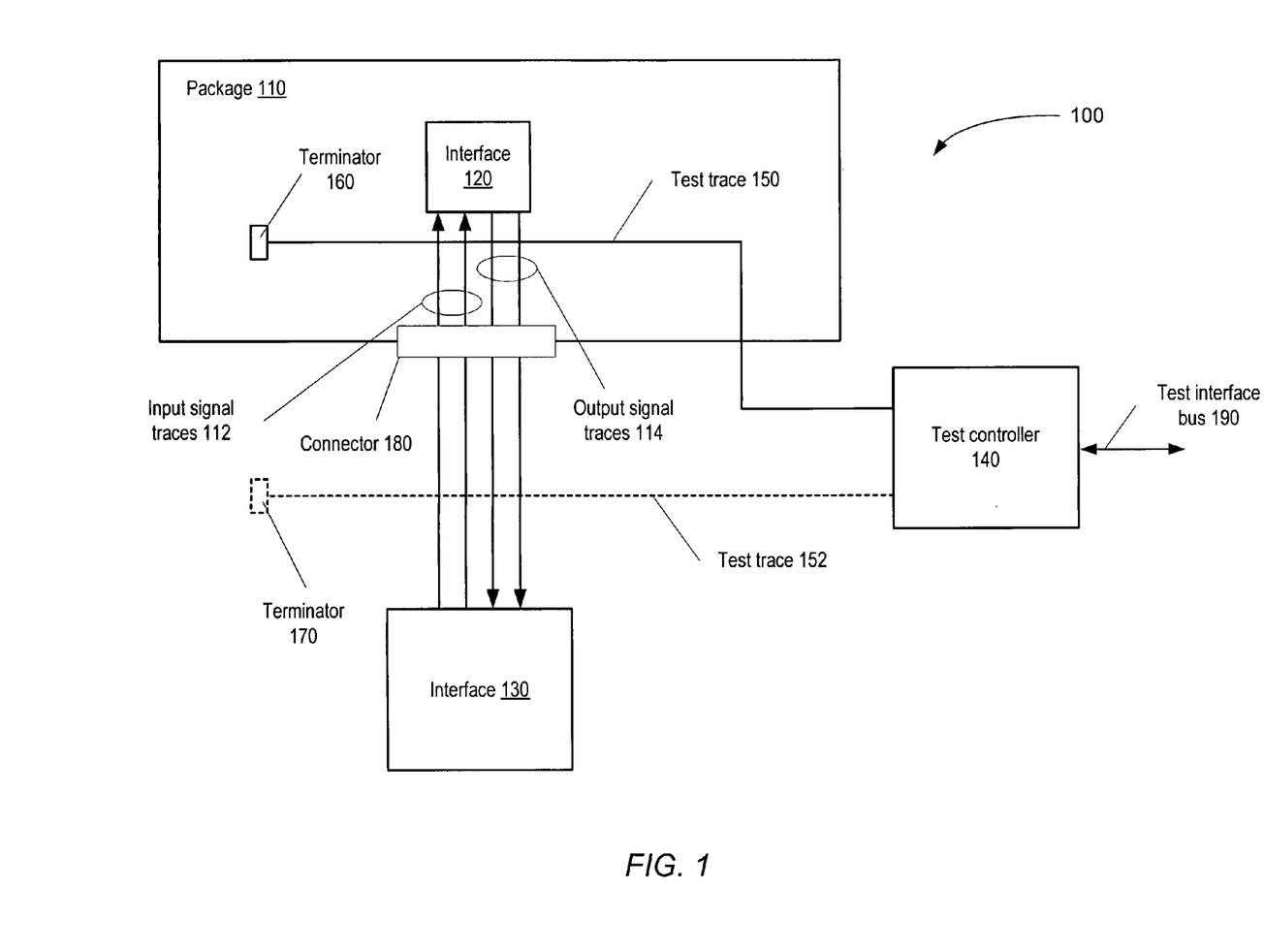
FIG. 1 is a block diagram illustrating one embodiment of a system including test and signal traces.

FIG. 1 depicts one embodiment of a system 100 that includes a variety of components and multiple communication paths, or channels. In the illustrated embodiment, system 100 includes a device package 110 that includes an interface device 120. In some embodiments, package 110 may correspond to a printed circuit board that may include multiple interconnect layers, and interface 120 may correspond to an integrated circuit component (e.g., a chip) or a "daughter" printed circuit board that may be mounted to package 110 via a fixed or separable mounting. In other embodiments, package 110 may correspond to another suitable type of chip- or board-carrying package. As described below, in some embodiments, package 110 may include other components in addition to interface 120, such as analog or digital integrated circuit chips, discrete electronic components such as resistors, capacitors and/or inductors, antennae, connectors or other suitable components.

In the illustrated embodiment, interface 120 may be configured to communicate with another interface device 130 external to package 110 via input signal traces 112 and output signal traces 114, which may correspond to printed circuit board (PCB) traces or other suitable transmission paths. For example, interfaces 120 and 130 may be configured to implement a component interconnect interface through which data and/or control information may be communicated between devices on package 110 and other portions of system 100 in which package 110 may be located. In various embodiments, such a component interconnect interface may include point-to-point interconnections, in which no interface devices other than interfaces 120 and 130 participate in communication; shared-bus interconnections, in which multiple interfaces 120 or 130 may be interconnected via the same set of signal conductors; or combinations of point-to-point and shared-bus interconnections. In the illustrated embodiment, package 110 may include a connector 180 configured to separably couple traces 112 and 114 to interface 130. For example, connector 180 may include a plug or other device configured for insertion into a receptacle, such as may be mounted on a separate board or backplane, such that package 110 may be inserted into or removed from the remainder of system 100. In other embodiments, connector 180 may be omitted and traces 112 and 114 may be permanently connected to interface 130, e.g., via soldered connections, continuous traces, discrete wires or any suitable combination of these.

In some embodiments, interfaces 120 and 130 may be configured to implement one or more high-bandwidth serial data transfer channels according to a serializer/deserializer (serdes) protocol, while in other embodiments interfaces 120 and 130 may be configured to implement one or more parallel data transfer channels. Generally speaking, in a serial data transfer channel, one bit of information may be transferred via the channel at any given time, while in a parallel data transfer channel, multiple bits may be separately and concurrently transferred via the channel. In some embodiments, a serial data transfer channel may be implemented via signal traces 112 and/or 114 using differential signaling, in which a pair of conductors may be configured to carry positive-sense and negative-sense signals corresponding to the channel, where the data value carried by the channel may be detected relative to a difference between the positive and negative sense signals. In other embodiments, single-ended signaling may be used for certain signals between interfaces 120 and 130, in which a single conductor may carry a signal that may be detected relative to a reference plane (e.g., a common ground plane).

Figure 2:
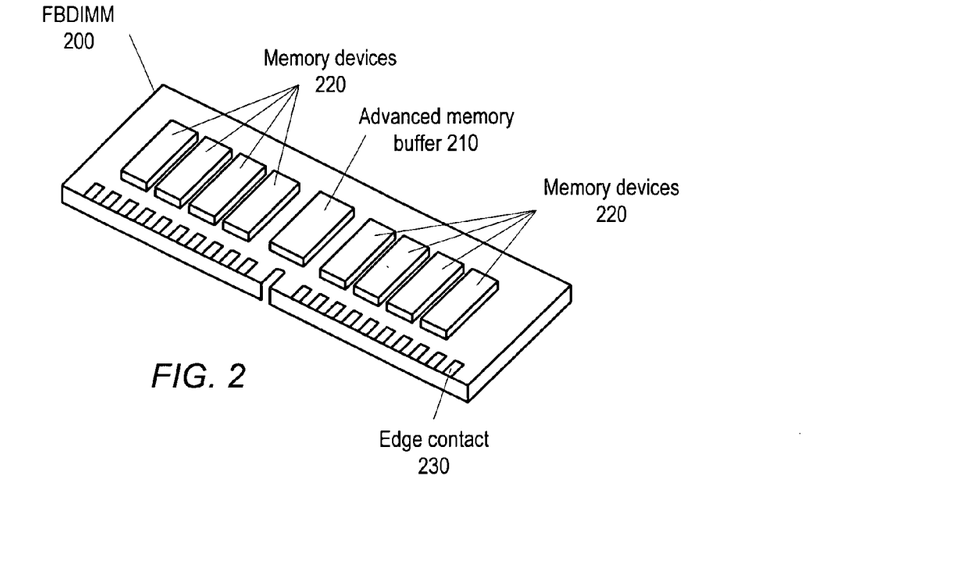
FIG. 2 is a block diagram illustrating one embodiment of a fully-buffered dual inline memory module (FBDIMM).

In one particular embodiment, package 110 may correspond to a Fully Buffered Dual Inline Memory Module (FB-DIMM), one exemplary embodiment of which is illustrated in FIG. 2. As illustrated, FBDIMM 200 may include an advanced memory buffer (AMB) 210 as well as a number of memory devices 220 and edge contacts 230. Generally speaking, AMB 210 may correspond to interface 120, and various ones of contacts 230 may correspond to ones of input signal traces 112 or output signal traces 114.

In one embodiment, AMB 210 may be configured to manage access to memory devices 220. For example, AMB 210 may be configured to interface with a memory controller (e.g., corresponding to interface 130) via one or more high-bandwidth serdes data channels connected via edge contacts 230 in order to implement command and data protocols to retrieve and store data from and to memory devices 220, perform error detection and/or correction with respect to memory devices 220 and the data channels, and to perform other functions suitable for the configuration and operation of FBDIMM 200. AMB 210 may also be configured to generally buffer the flow of data between the memory controller and memory devices 220. Thus, in some embodiments, AMB 210 may include control logic (e.g., state machines, an embedded processor, etc.) configured to implement the communication, control and management aspects of FBDIMM 200 as well as data storage resources configured for buffering data in transit to or from FBDIMM 200.

Memory devices 220 may generally correspond to any suitable type and density of random access memory (RAM). For example, memory devices 220 may correspond to individual Dual Data Rate Synchronous Dynamic RAM (DDR SDRAM) devices, although other types of static or dynamic RAM may also be employed. Edge contacts 230, which may also be referred to as edge fingers or simply fingers, may be configured for electrically coupling FBDIMM 200 to an appropriate socket or receptacle. For example, in one embodiment FBDIMM 200 may be configured for insertion into a socket or slot mounted on a printed circuit board such as a computer system backplane or motherboard. When so inserted, contacts 230 may couple signal traces on FBDIMM 200 to signal traces on the backplane, thus interfacing FBDIMM 200 with other system components such as a memory controller (e.g., interface 130). In one embodiment, the dimensions and composition of contacts 230 may be defined by a standard or common convention. For example, contacts 230 may be required to have a uniform length and width (e.g., approximately 30 mils wide and 90 mils long, where 1 mil equals $1/1000$ inch) and to be composed of materials having at least a minimum level of conductivity, oxidation characteristics or other parameters (e.g., gold, aluminum, copper, or alloys or plated combinations of materials). However, it is noted that the electrical and physical interfacing of some embodiments of FBDIMM 200 (or, more generally, package 110) may be proprietary in nature. For example, in some embodiments FBDIMM 200 may be configured for permanent (e.g., soldered) mounting rather than removable mounting.

In various sections of the following discussion, certain aspects of test trace techniques may be described with specific reference to features of FBDIMM 200. Alternatively, reference may be made to the general system of FIG. 1 with the understanding that such techniques may apply to corresponding features of FBDIMM 200. However, it is contemplated that the methods and techniques described herein need not be limited to memory modules in general or FBDIMM modules in particular, but may be generally applied to systems employing test trace methodologies with high speed signal traces.

Owing to defects arising during manufacturing, assembly or operation of system 100 or its various components, communication faults along signal paths between interfaces 120 and 130 may arise. For example, a particular one of traces 112 or 114 may become nonconductive (e.g., open-circuited) or may be short-circuited to a power or ground plane or another signal trace due to a manufacturing flaw, thermal stress, physical stress, electrostatic discharge, application of excess voltage or current or any other type of failure mode. Such a trace may completely fail to transmit signal information, or may impair transmission (e.g., due to attenuation, distortion, etc.) to the point where transmitted information is corrupted or lost. Alternatively, traces 112 and 114 may be conductively sound, but a driver or receiver circuit within one of interfaces 120 or 130 may be faulty, which may similarly result in failed or critically impaired signal transmission.

In the embodiment of FIG. 1, additional components may be provided to assist in determining whether traces 112 and 114 are operating normally or are faulty. Specifically, system 100 may include a test controller 140 that may be configured to monitor a test trace 150. As described in greater detail below, in some embodiments test trace 150 may be configured to detect a test signal driven on one or more of signal traces 112 or 114 during a test mode of operation of package 110, such as a signal generated by AMB 210 during a test mode of operation of FBDIMM 200, for example. Test controller 140 may then process the detected test signal to determine the fault status of a signal trace under test. In the illustrated embodiment, test controller 140 may support a test interface bus 190 through which operation (e.g., test mode behavior) of test controller 140 may be configured by other components within system 100, and through which test status information may be communicated to such other components. In various embodiments, test interface bus 190 may be configured to operate according to a version of the Inter-Integrated Circuit (I2C or I²C) bus standard, the Serial Peripheral Interface (SPI) bus standard, or any other suitable protocol for test-related communication and control. It is noted that in some embodiments, test trace 150 may be configured to test communication paths between package 110 and interface 130, where interface 130 may be located on a backplane to which package 110 interfaces, such as a motherboard. For example, test trace 150 may be configured to test a communication path between an individual instance of FBDIMM 200 and a corresponding memory controller. However, in other embodiments, test trace 150 may be configured to test communication paths between two different instances of package 110 that may be commonly connected. For example, two instances of FBDIMM 200 may be resident on the same motherboard and configured to communicate with one another via signal traces 112, 114 and respective AMBs 210.

In some embodiments, it is contemplated that test controller 140 may be integrated within package 110, for example as a discrete component or integrated within other components of package 110. In other embodiments, test controller 140 may be separate from package 110. For example, test controller 140 may be located on a system backplane. In certain embodiments, test controller 140 may be configured to monitor a number of different test traces located at different points within system 100 in addition to test trace 150, such as optional test trace 152. By monitoring the behavior of different test traces, test controller 140 may be configured to narrow or isolate the possible locations where a fault may occur. For example, if a signal originating from interface 120 is detected by test trace 150 but not test trace 152, the point of failure may be narrowed to some point between the two test traces (e.g., connector 180). As shown in FIG. 1, in some embodiments test trace 150 and/or optional test trace 152 may be respectively terminated via terminator 160 and/or optional terminator 170. Terminators 160 and 170 may be configured, for example, to approximate or match the impedance of the respective test trace in order to reduce undesired signal reflections or other transmission line effects. In some embodiments, however, terminators 160 and/or 170 may be omitted, resulting in open termination of test traces 150 and/or 152.

Generally speaking, test trace 150 may be routed in sufficient proximity to signal traces 112 and 114 to allow signals transmitted along the signal traces to capacitively couple onto test trace 150 for detection. In one embodiment, if a fault is suspected on a particular one of signal traces 112 or 114, an identifiable test signal may be driven onto the particular signal trace, while the other signal traces remain in a quiescent or steady state. Test trace 150 may then detect the test signal driven onto the particular signal trace via capacitive coupling of a portion of the test signal's energy onto test trace 150.

Test controller 140 may be configured to measure and analyze the test signal received via test trace 150 to determine whether the particular signal trace is operating normally or abnormally. For example, if no appreciable portion of the test signal can be detected on test trace 150, it is possible that the particular signal trace may be broken or short-circuited, or some other fault may exist between test trace 150 and the test signal source (e.g., interface 120) that prevents the test signal from propagating through the particular signal trace. In some embodiments, test controller 140 may be configured to perform additional analyses to detect various signal degradation conditions in addition to open-circuit and short-circuit conditions. For example, test controller 140 may be configured to perform various time- and/or frequency-domain analyses (e.g., slew rate analyses, spectral analyses, etc.) to ascertain whether the particular signal trace is transmitting the test signal according to expected operational standards. Discrepancies in such analyses may indicate the presence of more complex faults, such as a manufacturing defect that does not completely impair circuit operation, noise coupling due to shield failure, or other types of faults. In some embodiments, test controller 140 may be configured to perform only limited types of analysis on the test signal received via test trace 150, and may transmit test signal data via test interface bus 190 (e.g., as digitally-sampled data) to another component such as a digital signal processor or test analyzer for more sophisticated analysis.

In various embodiments, test controller 140 may be configured to employ various types of signal processing techniques in order to receive and process a test signal via test trace 150. Often, the received signal may be a small-amplitude, narrowband signal. Accordingly, test controller 140 may be configured to employ both amplification and filtering or selectivity in order to detect the test signal.

In one embodiment, test controller 140 may be configured to perform heterodyne mixing of a signal received via test trace 150. In one such embodiment, test controller 140 may be configured to amplify the received signal prior to mixing or multiplying the signal with an intermediate frequency or local oscillator frequency. Such mixing may produce signals at frequencies of both the sum and difference between the received signal frequency and the intermediate frequency. For example, mixing a 2 GHz test signal with a 1.95 GHz local oscillator signal may produce signals at both 3.95 GHz (sum) and 50 MHz (difference). In some cases, the lower-frequency difference signal may be more effectively and inexpensively filtered and amplified than a signal at the original, higher frequency, thus simplifying further processing of the received test signal. However, it is contemplated that in other embodiments, test controller 140 may employ a direct conversion receiver architecture, a superheterodyne architecture, or any other suitable receiver scheme. Regardless of the receiver scheme, in some embodiments test controller 140 may be configured to ultimately produce at least an indication of the relative strength or amplitude of the received test signal, although in other embodiments test controller 140 may perform other analyses as mentioned above.

Figure 3:
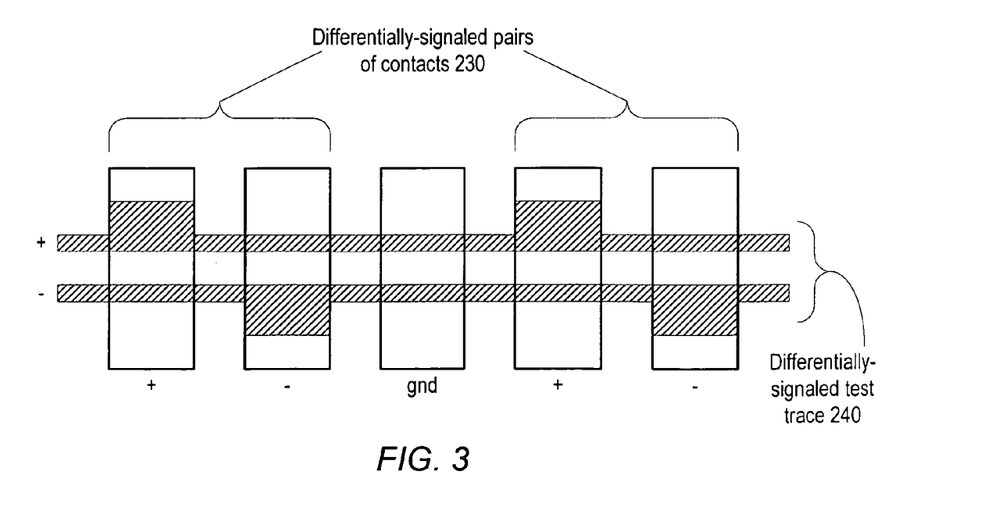
FIG. 3 is a block diagram illustrating one embodiment of routing and coupling of a test trace to signal traces within an FBDIMM.

One example of test trace routing and coupling to signal traces within one embodiment of FBDIMM 200 is shown in FIG. 3. In the illustrated embodiment, certain pairs of contacts 230 corresponding to input signal traces 112 or output signal traces 114 may be configured to implement differential signaling, in which one contact 230 of a given pair may carry a positive sense of the signal while the other contact 230 carries the negative sense. For example, a given pair of contacts 230 may be configured to interface a high-speed serdes data channel of FBDIMM 200 to a memory controller (e.g., interface 130). In one embodiment, a differentially-signaled test trace 240 corresponding to test trace 150 of FIG. 1 may be routed above or below contacts 230. As shown in FIG. 3 and described in greater detail below, for a given contact 230 having a particular signal sense (e.g., positive or negative), in one embodiment the coupling area of the corresponding sense of test trace 240 may be enhanced relative to the opposite sense of test trace 240. In the illustrated embodiment, pairs of contacts 230 configured to implement a differentially-signaled channel may be separated by contacts 230 that are coupled to a ground plane, for example to reduce the likelihood of crosstalk or interference occurring among adjacent pairs of signaling contacts 230. In such an embodiment, neither sense of test trace 240 may have enhanced coupling with respect to ground contacts 230 that separate signaling contacts 230.

During a test mode of operation of one embodiment of FBDIMM 200, AMB 210 may be configured to generate test signals to be driven on various ones of contacts 230. For example, AMB 210 may be configured to drive a pattern of logic 1's and 0's onto the particular signal trace to effectively generate a square wave having a particular frequency and duty cycle as determined by the 1/0 pattern. In some such embodiments, the possible configurations of the generated test signal may depend on the data transfer bandwidth(s) supported by FBDIMM 200. For example, if FBDIMM 200 supports 4.0 Gbit/second data transfers over serdes channels corresponding to contacts 230, AMB 210 may be configured to synthesize a 2 GHz square wave on a particular channel by sending an alternating pattern of logic 1's and logic 0's (e.g., 10101010 . . . ) through that channel. Alternatively, AMB 210 may be configured to synthesize a 400 MHz square wave by sending an alternating pattern of five consecutive logic 1's and five consecutive logic 0's (e.g., 1111100000111110000 0 . . . ) through the channel. It is noted that in some embodiments, the possible test signal frequencies for symmetric square waves that may be generated using this technique may be restricted to values satisfying the ratio B/(2N), where B corresponds to the maximum data signaling rate supported by FBDIMM 200 (e.g., 4.0 GHz in a 4.0 Gbit/sec embodiment, 3.2 GHz in a 3.2 Gbit/sec embodiment, etc.) and N is an integer corresponding to the number of consecutive 1's and 0's in the test signal pattern. That is, in such embodiments the test signal frequency may not be continuously variable.

Tuning of Test Traces

As described above, during a test mode of operation of package 110, a test signal may be driven on a particular one or ones of signal traces 112 or 114. For example, AMB 210 may drive a square wave onto a particular pair of differentially-signaled contacts 230. Capacitive coupling of the test signal from the signal trace onto one or more test traces (e.g., differentially-signaled test trace 240) may result in a detectable signal that may be processed by test controller 140 to determine the operational status of the signal trace(s) under test.

A number of practical challenges may exist in implementing such a test strategy. For example, the capacitive coupling between a signal trace 112 or 114 and a test trace 150 may exist whether or not the test trace is actually being used. If the degree or amount of this capacitive coupling is too large, normal operation of the signal trace may be negatively affected as signal energy "leaks" onto the test trace. This may result in distortion, jitter or other types of signal degradation with respect to the normal operating mode behavior of the signal traces. In turn, such degradation may increase the sensitivity of package 110 to other types of defects, requiring tighter tolerances in manufacturing and/or operating conditions to ensure that parameters for device operating margins are satisfied. In extreme cases, an arbitrarily large coupling capacitance might render a signal trace unusable for normal operation, for example if the signal were so distorted that it could not satisfy minimum timing or other signaling requirements for data transfer as defined by the signal interface (e.g., whether a differential serdes or another type of interface).

While minimizing the capacitive coupling of test trace 150 may correspondingly minimize the performance impact to the signal traces 112/114, without at least some degree of coupling little or no detectable signal may appear on the test trace. Moreover, a small-amplitude signal on test trace 150 that may be detectable by test controller 140 under ideal conditions, such as a laboratory environment with few noise sources, may be difficult to detect under other, noisier conditions. For example, package 110 may be deployed in a system that includes other active components such as peripherals, microprocessors, radio frequency components, etc., any of which may produce signals that may directly or indirectly interfere with a small-amplitude signal on test trace 150, such as by capacitive or inductive coupling onto test trace 150 or via other interference paths. Since test trace 150 may be capacitively coupled to a number of signal traces 112 or 114, which may in turn be coupled to various noise sources, numerous opportunities for noise coupling may exist. To the extent that the portion of the test signal coupled onto test trace 150 is distorted or otherwise interfered with by unwanted signals, it may be difficult or impossible for test controller 140 to properly analyze the test signal and produce meaningful test results.

In some embodiments, various components of package 110 may be configured such that test trace 150 produces a band-pass frequency response that includes a passband and a stop-band. That is, test trace 150 may be configured as a bandpass filter with respect to signals received from signal traces 112 and/or 114. Generally speaking, a passband may correspond to frequencies that, when input to a bandpass filter, may effectively pass through the filter with minimal attenuation. By contrast, a stopband may correspond to those frequencies that are significantly attenuated by the bandpass filter. In a simple example of a bandpass frequency response, a single contiguous passband range of frequencies may be surrounded by a discontiguous stopband range of frequencies, although it is contemplated that more complex filters may exhibit multiple distinct ranges of frequencies for either the passband or the stopband. The distinction between whether a given frequency falls within the passband or stopband may depend on the characteristics of the filter and the requirements of its application. One common metric for distinguishing between passband and stopband frequencies is referred to as the cutoff frequency or knee frequency, which may correspond to the point at which the power output of the filter is approximately one-half of the passband power output, or approximately 3 decibels (dB) of attenuation relative to the passband. Signals having more than 3 dB of attenuation may be identified as stopband frequencies. However, it is contemplated that other metrics may be employed to distinguish between regions of a filter's frequency response.

More specifically, in some embodiments various physical characteristics of test trace 150 may be tuned in order to produce a bandpass frequency response that may allow the frequency of a test signal coupled onto test trace 150, or a particular harmonic of the test signal frequency (or simply, the test frequency), to pass according to a specified transmission requirement, such as a maximum level of attenuation, for example. At the same time, the frequency response of test trace 150 may be tuned such that at least some frequencies other than the test frequency or its particular harmonic may be rejected according to a specified attenuation requirement, such as a minimum level of attenuation. For example, test trace 150 may be tuned such that common anticipated noise frequencies may be included in the stopband of the frequency response, while the test frequency or its particular harmonic may be included in the passband.

It is noted that a bandpass filter having a single contiguous passband ranging from a first frequency to a second frequency, where the second frequency is higher than the first frequency, may be realized as the superposition of a low-pass filter (LPF) that is configured to pass frequencies below the second frequency (and correspondingly reject higher frequencies) and a high-pass filter (HPF) that is configured to pass frequencies above the first frequency (and correspondingly reject lower frequencies). Through superposition or combination of an LPF and a HPF configured in this way, frequencies outside the passband defined by the first and second frequencies may be attenuated, giving rise to a bandpass frequency response.

In some embodiments, test trace 150 may exhibit both LPF and HPF characteristics arising from various circuit phenomena; that is, of the electrophysical properties of the components of test trace 150 in relation to the components to which test trace 150 is directly or indirectly (e.g., capacitively) coupled. For example, test trace 150 may exhibit skin effect behavior in which conductive current of a signal becomes confined to an increasingly shallow cross-sectional region of test trace 150 as the signal frequency increases. Owing to this effect, the effective resistance of test trace 150 may increase with frequency, causing greater resistive energy dissipation of higher-frequency signals than of lower-frequency signals. Impedance discontinuities within test trace 150, for example arising from the presence of vias between layers of a printed circuit board, or impedance mismatches arising from the characteristics of the terminator 160 used to terminate test trace 150 may give rise to signal reflections that may increase signal attenuation as signal frequency increases. Thus, each of the foregoing effects may result in LPF-type circuit behavior. By contrast, the capacitive coupling of signal traces to test trace 150 may attenuate lower-frequency signals while presenting lower impedance to higher-frequency signals. For example, disregarding leakage effects, a capacitor may effectively block (e.g., present infinite impedance to) a signal having a frequency of zero (i.e., direct current) while presenting effectively zero impedance to a signal having infinite frequency. This may be generally characteristic of HPF-type circuit behavior.

As noted above, in some embodiments the superposition of LPF and HPF characteristics of a circuit may give rise to bandpass filter characteristics. Thus, the various circuit phenomena that lead to LPF and HPF behaviors within test trace 150 may yield the potential for bandpass frequency response behavior. However, without tuning to achieve a desired frequency response, the default behavior of test trace 150 may not be effective in reducing the susceptibility of a test signal to the noise sources discussed above.

Figure 4:
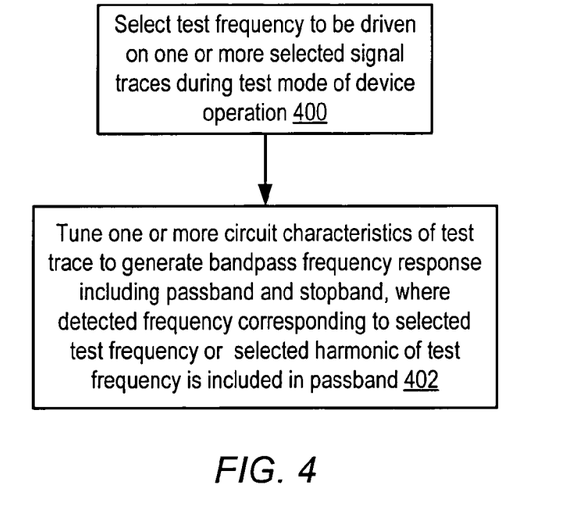
FIG. 4 is a flow chart illustrating one embodiment of a method of configuring a device including a test trace capacitively coupled to signal traces.

One embodiment of a method for determining a configuration of a device, such as package 110, that includes one or more test traces 150 configured to capacitively couple to various ones of a number of signal traces 112 or 114 is illustrated in FIG. 4. Referring collectively to FIGS. 1-4, operation begins in block 400 where a test frequency of a test signal to be driven on one or more selected ones of the signal traces during a test mode of operation of the device is selected. In some embodiments, the test frequency may be selected from one of a limited number of possible frequencies supported by the device. For example, in an embodiment where the device to be configured corresponds to an embodiment of FBDIMM 200, the selected test signal frequency may be restricted to those test frequencies that AMB 210 can be configured to generate, as described above.

Also, in some embodiments the selection of the test frequency may take into account anticipated sources of noise, such that the selected test frequency or one of its harmonics (e.g., an integral multiple of the test frequency) lies in a region of the frequency spectrum that is expected to be relatively free of anticipated noise. For example, a given system including microprocessors, memory devices, peripherals and/or other similar components may have a substantial potential for generating unwanted signals at frequencies less than 1 GHz. In such a system, the test frequency may be selected such that the frequency or a selected harmonic lies at, e.g., 2 GHz. For example, 2 GHz may be chosen as the fundamental frequency of the test signal. Alternatively, in cases where a 400 MHz signal produces a sufficiently strong $5^{th}$ harmonic component in test trace 150 at 2 GHz, 400 MHz may be chosen as the fundamental frequency of the test signal.

Subsequently, one or more circuit characteristics of a given test trace 150 may be tuned to generate a bandpass frequency response of the given test trace 150 that includes a passband and a stopband, where a detection frequency that corresponds to either the selected test frequency or a selected harmonic of the selected test frequency is included in the passband (block 402). Referring to the example given above, the detection frequency may correspond to the 2 GHz frequency that lies outside the expected noise region of the spectrum. This frequency may either correspond to the test frequency of the test signal as driven onto a signal trace, or to a selected harmonic (e.g., the $5^{th}$ harmonic) of the fundamental test frequency. It is noted that in some embodiments, tuning of circuit characteristics may be performed in a simulation environment in which desired values or configurations of circuit characteristics may be selected from among various possible configurations according to the desired tuning. Circuit behavior using the selected circuit configuration may then be verified using simulation models of circuit components. In other embodiments, tuning may be verified using actual circuit components, for example in a laboratory or manufacturing environment.

As noted above, a number of different circuit characteristics of test trace 150 may influence the LPF or HPF behavior of the test trace. For example, varying the degree of capacitive coupling between the test and signal traces may affect the placement of the HPF cutoff frequency within the frequency spectrum. Correspondingly, in one embodiment, tuning one or more circuit characteristics of a given test trace 150 may include selecting a degree of capacitive coupling between given test trace 150 and each of the signal traces 112 or 114 to which given test trace 150 is capacitively coupled such that, within a specified constraint for signal degradation on the signal traces, the bandpass frequency response of given test trace 150 satisfies a specified transmission requirement at the detection frequency. Generally speaking, the specified transmission requirement may correspond to any suitable formulation or expression of the power, amplitude, detectability or other figure of merit of the detection frequency, expressed in absolute or relative terms. For example, the specified transmission requirement may include a requirement that a signal at the detected test frequency be at least a certain number of decibels higher than a particular stopband frequency, such as an upper limit of an expected noise range or the frequency of a particularly aggressive noise source.

Different degrees of capacitive coupling of test trace 150 onto signal traces present different degrees of potential signal degradation on those signal traces. As described previously, capacitive coupling to test trace 150 may present a signal leakage path during normal operation of signal traces 112 and 114, which may in turn negatively affect various figures of merit for signal transmission along the signal traces such as slew rate, jitter, distortion or other quality criteria. As such, tuning of the test mode behavior of test trace 150 as described above may be performed under the constraint that such tuning limit the potential for signal degradation on the signal traces to a particular constraint. Such a constraint may be specified in any suitable terms or combination of terms, such as units of time (e.g., for constraints on jitter or slew rate degradation), power loss, or other measurable characteristics. In some embodiments, such a signal degradation constraint may also be expressed in functional terms, such as a maximum impact to net communication bandwidth, bit error rate, or other functional characteristics.

In various embodiments, capacitive coupling between a given test trace 150 and signal traces 112 and 114 may be varied in a number of different ways. For example, coupling capacitance may be increased or decreased by varying the dielectric constant of the material separating the traces, such as by varying the choice of materials used to separate signal layers within package 110. Coupling capacitance may also be altered by varying geometric aspects of the coupled traces, such as the total coupling area as well as the distance between the coupled areas. As shown in FIG. 3, coupling area between test trace 240 and contacts 230 may be increased for coupling of same-sense conductors. For example, in one embodiment, the coupling area of opposite-sense conductors in FIG. 3 may be approximately 4 by 30 mils, while the coupling area of same-sense conductors may be approximately 12 by 30 mils. Taking into account parasitic effects between the differentially-signaled conductors of test trace 240, the net coupling capacitance for same-sense conductors in this configuration may be roughly twice that of opposite-sense conductors. The degree of same-sense capacitive coupling may be further increased by increasing coupling area, which may increase the amount of test signal energy coupled from contacts 230 to test trace 240. However, as noted above, increased coupling may also increase signal degradation on contacts 230 and may increase the susceptibility of test trace 240 to lower-frequency noise components, for example by decreasing the cutoff frequency of the HPF effect created by the coupling capacitance.

Figure 5:
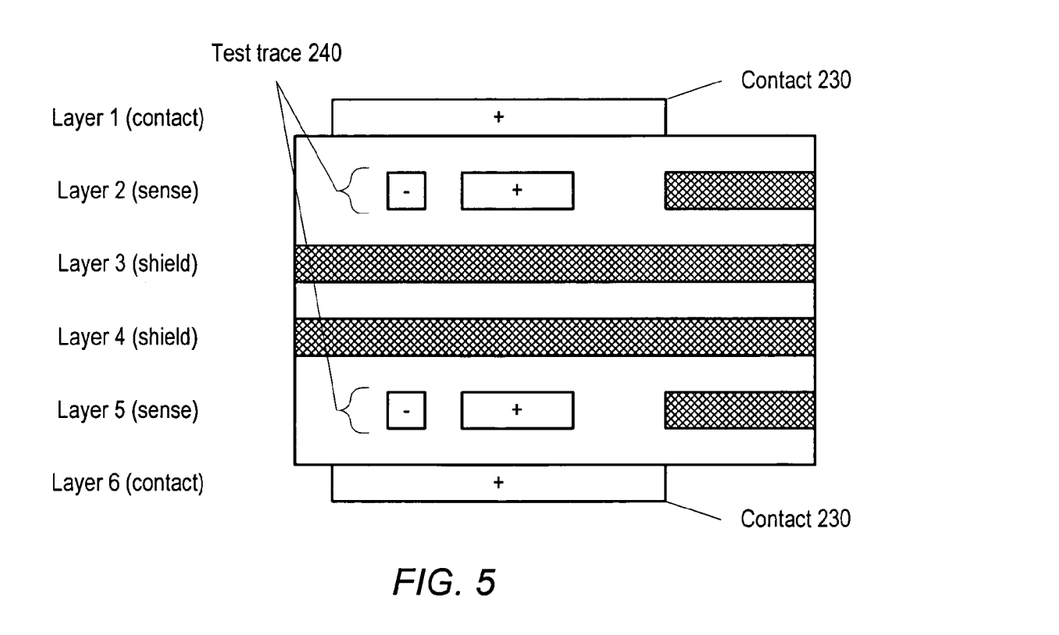
FIG. 5 is a block diagram illustrating a cross-sectional view of an embodiment of an FBDIMM implemented on a six-layer printed circuit board.

FIG. 5 illustrates a cross-sectional view of one embodiment of FBDIMM 200. In the illustrated embodiment, FBDIMM 200 is implemented as a six-layer printed circuit board having contacts 230 on both outermost layers, denoted layers 1 and 6. (Relative dimensions of layers are not shown to scale.) Test trace 240 is routed generally perpendicularly to contacts 230 on the layers immediately beneath the signal layers, denoted layers 2 and 5. In one embodiment, the respective metal conductors of test trace 240 on layers 2 and 5 may be electrically connected by one or more sets of vias. For example, such vias may be located at one edge of FBDIMM 200, outside the outermost contact 230. In the illustrated embodiment, innermost layers 3 and 4 include shielding components, which may include metal layers coupled to a power or ground plane. Shielding may also exist on layers 2 and 5 outside the region in which test trace 240 is located. It is noted that only positive-sense contacts 230 are shown in FIG. 5, and that the relative cross-sectional dimensions of test trace 240 may be inverted for negative-sense contacts 230.

Figure 6A:
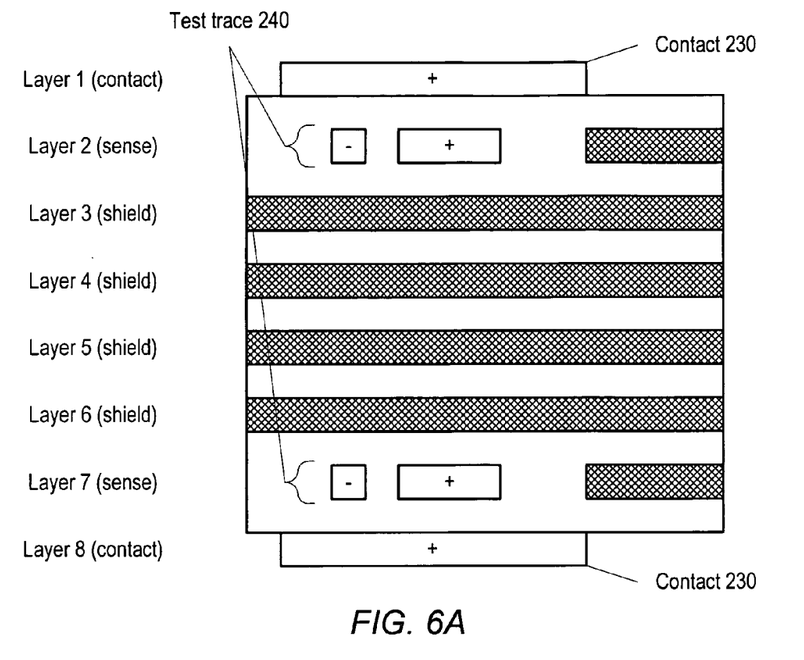
FIGS. 6A-B are block diagrams illustrating cross-sectional views of different embodiments of an FBDIMM implemented on an eight-layer printed circuit board.
Figure 6B:
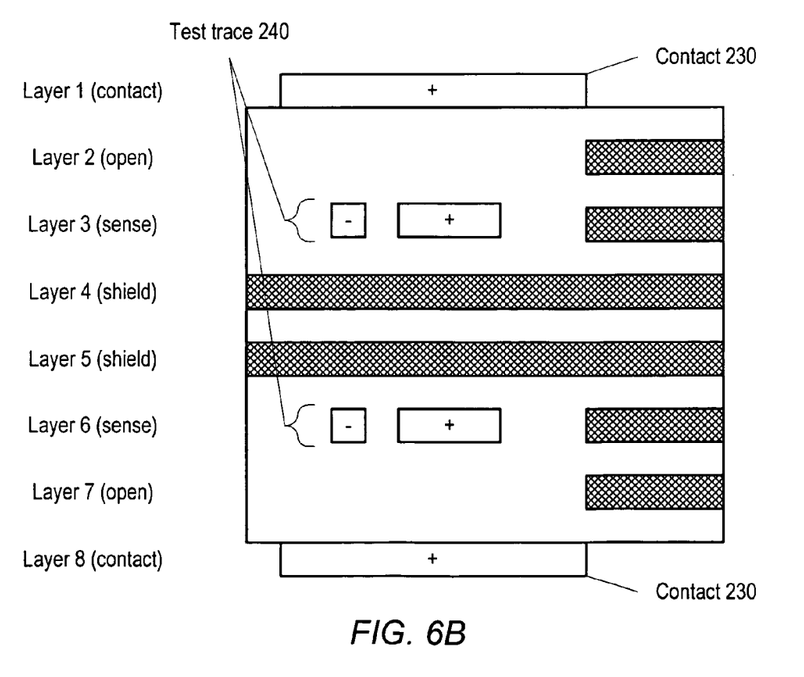

Embodiments of FBDIMM 200 that are implemented on boards having a higher number of layers may present additional opportunities for varying coupling capacitance between test trace 240 and contacts 230. FIGS. 6A-B illustrate possible configurations of an eight-layer board. In FIG. 6A, test trace 240 is routed on the layers immediately beneath the signal layers in a manner similar to the six-layer board of FIG. 5, providing four inner shielding layers rather than two. However, in the embodiment of FIG. 6B, test trace 240 is routed on layers 3 and 6, leaving layers 2 and 7 open between test trace 240 and contacts 230. Assuming comparable layer thicknesses between the six-layer and eight-layer implementations, the arrangement of FIG. 6B may reduce the overall coupling capacitance between test trace 240 and contacts 230 relative to the configurations of FIGS. 5 and 6A, owing to the increased distance between the coupled traces.

Tuning of circuit characteristics of test trace 150 need not be limited to varying capacitive coupling. As described above, LPF characteristics of test trace 150 may be affected by factors such as skin effect and impedance discontinuities. Correspondingly, in some embodiments tuning the circuit characteristics of test trace 150 may include altering these or other aspects of test trace 150. For example, the resistance of test trace 150 may be increased by reducing its cross-sectional area, such as by decreasing its width. This may have a more pronounced effect on the dissipation of higher frequencies that are more sensitive to the skin effect, which may reduce the cutoff point of the LPF behavior of test trace 150. LPF behavior may also be tuned by introducing or enhancing impedance discontinuities or mismatches. For example, vias or stubs may be added along the path of test trace 150, and/or the impedance of terminator 160 may be altered. Such impedance effects may increase reflections and destructive interference at higher frequencies.

It is noted that in some embodiments, tuning the circuit characteristics of test trace 150 may be a significantly constrained process. For example, for a given arrangement of signal traces 112 and 114 and test trace 150, there may exist practical limits to the degree to which coupling capacitance may be adjusted. Such limits may include limitations on the effective coupling area or distance between coupled traces that can be implemented. For example, apart from issues of signal degradation and transmission requirements, the maximum possible coupling area between test trace 240 and contacts 230 of FBDIMM 200 may be dictated by the dimensions of contacts 230, which may be fixed according to a standard. Moreover, tuning parameters may be adjustable only in coarse increments. For example, while layer separation may be used to adjust coupling capacitance as described above with respect to FIG. 6B, layer dimensions may be strictly defined such that only a small set of separation values are possible. In some embodiments, the choice of the detection frequency to be tuned for may be dependent on the constraints of tuning test trace 150 within package 110, in addition to noise considerations and constraints on the test frequencies that can be generated as described above.

One example of a frequency response for a particular test trace configuration that may be produced according to the methods and techniques described above is illustrated in FIG. 7. The illustrated frequency response may correspond to a configuration of an embodiment of FBDIMM 200 as generally described above in conjunction with the descriptions of FIGS. 2 and 3, and may be generated through simulation of a circuit model reflecting the appropriate circuit characteristics resulting from the selection and tuning process. For the illustrated frequency response, capacitive coupling between same-sense signal and test traces may be modeled as approximately 0.135 pF, while coupling between opposite-sense traces may be modeled as approximately 0.068 pF. Termination resistance corresponding to terminator 160 may be modeled as 50 ohms.

Figure 7:
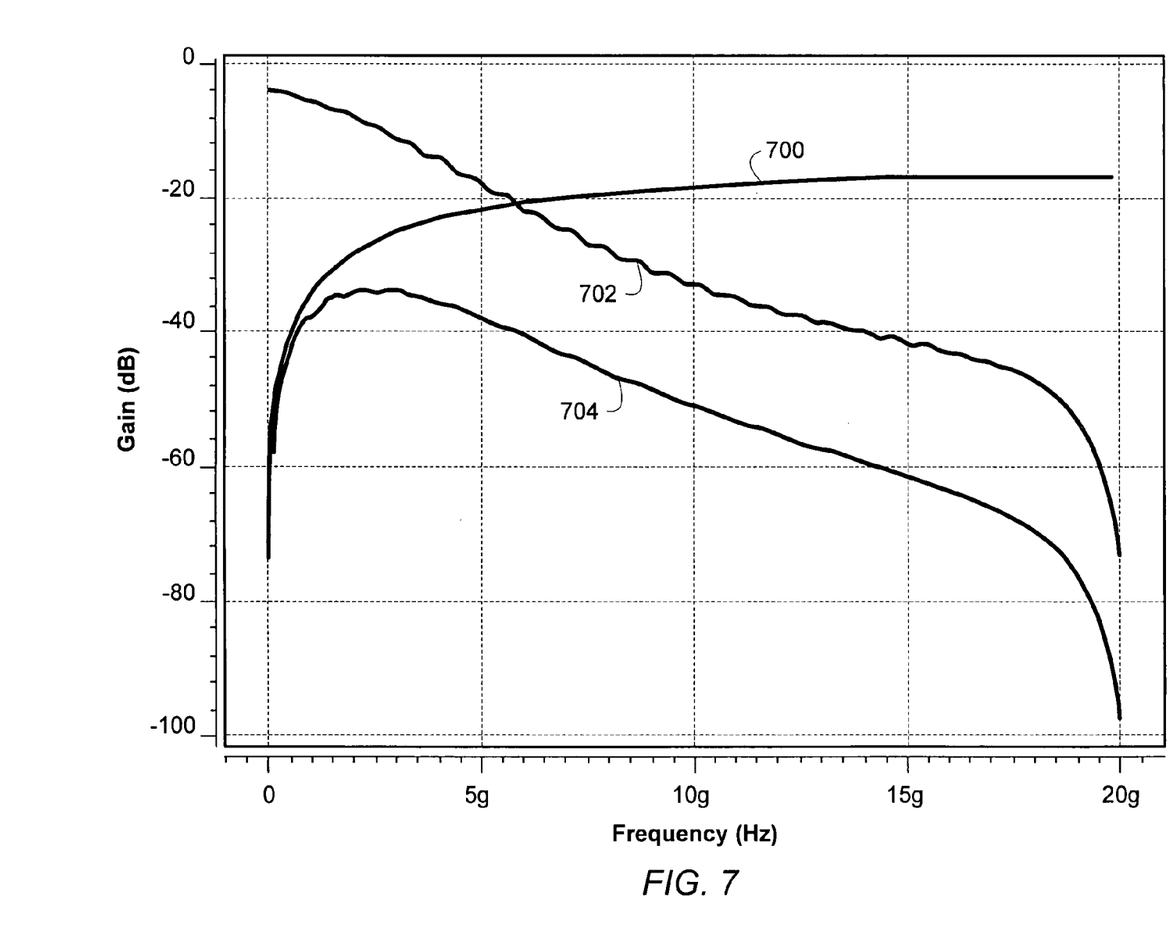
FIG. 7 illustrates an exemplary frequency response of an FBDIMM test trace tuned to produce a particular bandpass frequency response.

The LPF and HPF characteristics resulting from this example configuration of test trace 150 are shown individually in FIG. 7 as HPF response 700 and LPF response 702. Additionally, the superposition of these characteristics is shown to illustrate bandpass frequency response 704. In the illustrated embodiment, signal gains at 2 GHz, 400 MHz and 100 MHz are approximately −33 dB, −43 dB and −55 dB, respectively, while attenuation rolls off more gradually in the high band. Thus, for a detection frequency of 2 GHz, this configuration of test trace 150 may provide at least 10 dB of relative attenuation for signals at or below 400 MHz and for signals at or above approximately 6 GHz. In a system environment where high-energy noise signals exist in these lower or upper frequency ranges, such filtering may substantially improve the reliability with which a test signal capacitively coupled onto test trace 150 may be detected. For example, a noise source at 100 MHz may be attenuated by roughly 22 dB relative to the test signal at the detected frequency of 2 GHz, which may significantly improve the ability of test controller 140 to detect and process the test signal. It is contemplated that in other embodiments, alternative tunings of test trace 150 may be employed as described above to generate different frequency responses.

It is noted that the methods and techniques described above may be employed in any suitable fashion to determine the configuration of a device (e.g., package 110) including a test trace capacitively coupled to a number of signal traces. Specifically, the tuning technique described above may be employed (e.g., during a device design procedure or process) to determine a physical arrangement of the test trace relative to the signal traces, and/or to determine various other properties or characteristics of the arrangement (e.g., electrical properties, material characteristics, etc.). The device may then be manufactured to implement the configuration or arrangement determined through the tuning process.

In some embodiments, it is contemplated that the device configuration may be determined in part or in whole during the manufacturing process, rather than during a design process that concludes prior to manufacturing. For example, a device including a test trace capacitively coupled to a number of signal traces may be fully or partially manufactured according to a baseline set of parameters and then tested within the manufacturing environment. If indicated by the test results, the test trace may be additionally tuned. In some embodiments, to perform such additional tuning, the device may be reworked, such as by removing, replacing or augmenting components, metal layers, etc. For example, metal may be added to or removed from the test trace in the vicinity of a signal trace to alter coupling to that signal trace, termination characteristics may be changed, etc.

It is contemplated that in some embodiments, any of the methods or techniques for test trace tuning described above may be implemented as program instructions and data capable of being stored or conveyed via a computer-accessible medium. For example, such techniques may be implemented via computer-aided design software, circuit simulation software, or other types of software applications. In such embodiments, program instructions may be executed to perform a particular computational function, such as a particular method or portion of a method described above, as well as to provide more general operating system functionality, application functionality, and/or any other suitable functions.

Figure 8:
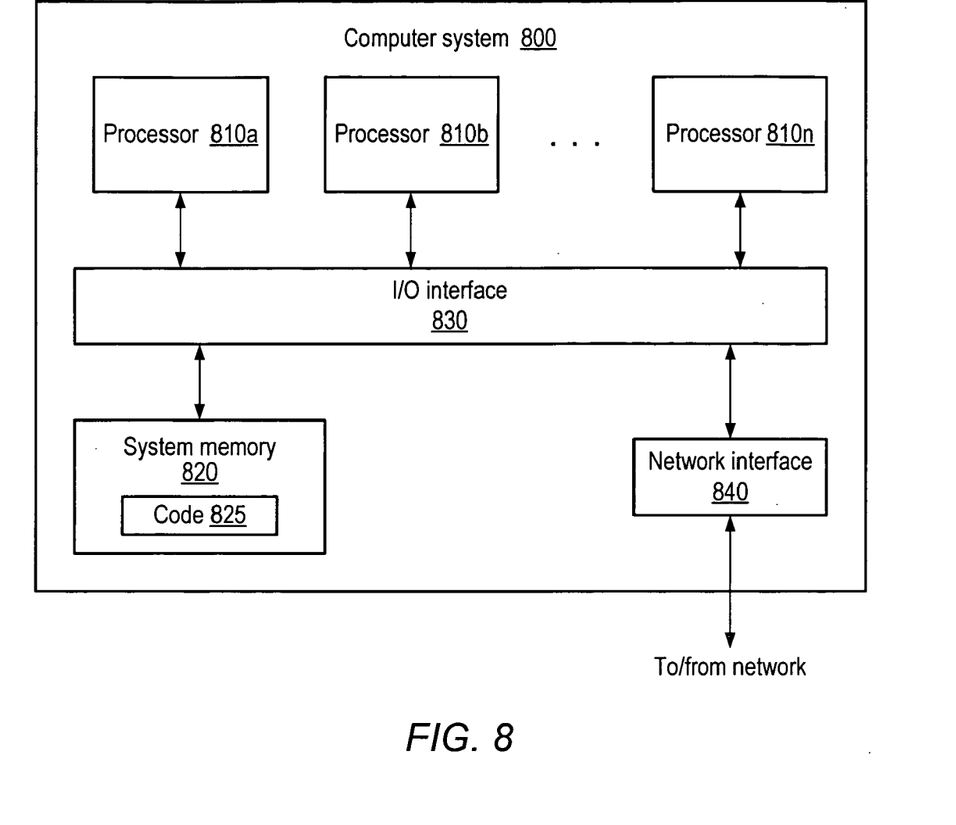
FIG. 8 illustrates an exemplary embodiment of a computer system including a computer-accessible medium configured to store program instructions.

One exemplary embodiment of a computer system including computer-accessible media is illustrated in FIG. 8. Such a system may also be referred to as a node or a computing node, and it is noted that not all of the functions of the methods and techniques described above need be implemented via the same node. Rather, in some embodiments these functions may be implemented in a distributed fashion among a number of nodes. In the illustrated embodiment, computer system 800 includes one or more processors 810 coupled to a system memory 820 via an input/output (I/O) interface 830. Computer system 800 further includes a network interface 840 coupled to I/O interface 830.

In various embodiments computer system 800 may be a uniprocessor system including one processor 810, or a multiprocessor system including several processors 810 (e.g., two, four, eight, or another suitable number). Processors 810 may be any suitable processor capable of executing instructions. For example, in various embodiments processors 810 may be a general-purpose or embedded processor implementing any of a variety of instruction set architectures (ISAs), such as the x86, PowerPC, SPARC, or MIPS ISAs, or any other suitable ISA. In multiprocessor systems, each of processors 810 may commonly, but need not necessarily, implement the same ISA.

System memory 820 may be configured to store instructions and data accessible by process 810. In various embodiments, system memory 820 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as any of those storage service system components and other functions described in detail above, are shown stored within system memory 820 as code 825.

In one embodiment, I/O interface 830 may be configured to coordinate I/O traffic between processor 810, system memory 820, and any peripheral devices in the device, including network interface 840 or other peripheral interfaces. In some embodiments, I/O interface 830 may perform any necessary protocol, timing or other data transformations to convert data signals from one component (e.g., system memory 820) into a format suitable for use by another component (e.g., processor 810). In some embodiments, I/O interface 830 may include support for devices attached through various types of peripheral buses, such as a variant of the Peripheral Component Interconnect (PCI) bus standard or the Universal Serial Bus (USB) standard, for example. In some embodiments, the function of I/O interface 830 may be split into two or more separate components, such as a north bridge and a south bridge, for example. Also, in some embodiments some or all of the functionality of I/O interface 830, such as an interface to system memory 820, may be incorporated directly into processor 810.

Network interface 840 may be configured to allow data to be exchanged between computer system 800 and other devices attached to a network, such as other computer systems, for example. In various embodiments, network interface 840 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

In some embodiments, system memory 820 may be one embodiment of a computer-accessible medium configured to store program instructions and data as described above. However, in other embodiments, program instructions and/or data may be received, sent or stored upon different types of computer-accessible media. Generally speaking, a computer-accessible medium may include storage media or memory media such as magnetic or optical media, e.g., disk or CD/DVD-ROM coupled to computer system 800 via I/O interface 830. A computer-accessible medium may also include any volatile or non-volatile media such as RAM (e.g. SDRAM, DDR SDRAM, RDRAM, SRAM, etc.), ROM, etc, that may be included in some embodiments of computer system 800 as system memory 820 or another type of memory. Program instructions and data stored via a computer-accessible medium may be transmitted by transmission media or signals such as electrical, electromagnetic, or digital signals, which may be conveyed via a communication medium such as a network and/or a wireless link, such as may be implemented via network interface 840.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for determining a configuration of a device comprising a plurality of signal traces and one or more test traces configured to capacitively couple to said plurality of signal traces, the method comprising:

selecting a test frequency of a test signal to be driven on selected ones of said plurality of signal traces during a test mode of operation of said device; and tuning one or more circuit characteristics of a given one of said one or more test traces to generate a bandpass frequency response of said given test trace including a passband and a stopband, wherein a detection frequency corresponding either to said test frequency or a selected harmonic of said test frequency is included in said passband;

wherein said tuning one or more circuit characteristics of said given test trace comprises selecting a degree of capacitive coupling between said given test trace and each of multiple ones of said plurality of signal traces such that, within a specified constraint for signal degradation on said multiple ones of said signal traces, said bandpass frequency response of said given test trace satisfies a specified transmission requirement at said detection frequency.

2. The method as recited in claim 1, wherein an anticipated noise frequency is included in said stopband.

3. The method as recited in claim 1, wherein said selecting a degree of capacitive coupling between said given test trace and each of said multiple ones of said signal traces comprises selecting an amount of coupling area in which said given test trace and each of said multiple signal traces overlap.

4. The method as recited in claim 1, wherein said selecting a degree of capacitive coupling between said given test trace and each of said multiple ones of said signal traces comprises selecting an amount of distance between said given test trace and each of said multiple signal traces.

5. The method as recited in claim 4, wherein said device comprises a plurality of printed circuit board layers each configured for routing of traces, and wherein said selecting an amount of distance between said given test trace and each of said multiple signal traces comprises selecting a particular one of said plurality of printed circuit board layers for routing of said given test trace relative to another one of said plurality of printed circuit board layers configured for routing said multiple signal traces.

6. The method as recited in claim 1, wherein said selecting a degree of capacitive coupling between said given test trace and each of said multiple ones of said signal traces comprises selecting a dielectric material for separating said given test trace and each of said multiple signal traces dependent upon a dielectric constant of said dielectric material.

7. The method as recited in claim 1, wherein said given test trace is terminated by a terminator having a particular impedance, and wherein said tuning one or more circuit characteristics of said given test trace comprises selecting said particular impedance.

8. The method as recited in claim 1, wherein said tuning one or more circuit characteristics of said given test trace comprises introducing impedance discontinuities along a path of said given test trace.

9. The method as recited in claim 1, wherein each of said given test trace and said multiple ones of said signal traces includes a respective differentially-signaled pair of conductors.

10. The method as recited in claim 9, wherein said selecting a degree of capacitive coupling between said given test trace and each of multiple ones of said plurality of signal traces comprises selecting first and second coupling areas for respective coupling between same-sense and opposite-sense conductors of said given test trace and said multiple ones of said signal traces, wherein said first coupling area is larger than said second coupling area.

11. The method as recited in claim 1, wherein said specified transmission requirement specifies a minimum level of attenuation of a particular noise frequency relative to said detection frequency.

12. The method as recited in claim 1, wherein said a specified constraint for signal degradation on said multiple ones of said signal traces specifies a maximum level of timing jitter on said multiple ones of said signal traces that is attributable to said degree of capacitive coupling.

13. The method as recited in claim 1, wherein said device corresponds to a fully buffered dual inline memory module (FBDIMM) comprising a plurality of edge contacts respectively corresponding to said plurality of signal traces.

14. The method as recited in claim 13, wherein said FBDIMM comprises an advanced memory buffer (AMB) configured to generate said test signal according to a constrained set of frequencies, and wherein said selecting said test frequency of said test signal is performed dependent upon said constrained set of frequencies.

15. A method for determining a configuration of a device comprising a plurality of signal traces and one or more test traces configured to capacitively couple to said plurality of signal traces, the method comprising:

selecting a test frequency of a test signal to be driven on selected ones of said plurality of signal traces during a test mode of operation of said device; and tuning one or more circuit characteristics of a given one of said one or more test traces to generate a bandpass frequency response of said given test trace including a passband and a stopband, wherein a detection frequency corresponding either to said test frequency or a selected harmonic of said test frequency is included in said passband and wherein an anticipated noise frequency is included in said stopband.

16. The method as recited in claim 15, wherein said device corresponds to a fully buffered dual inline memory module (FBDIMM) comprising a plurality of edge contacts respectively corresponding to said plurality of signal traces.

17. The method as recited in claim 16, wherein said FBDIMM comprises an advanced memory buffer (AMB) configured to generate said test signal according to a constrained set of frequencies, and wherein said selecting said test frequency of said test signal is performed dependent upon said constrained set of frequencies.

18. The method as recited in claim 15, wherein said tuning one or more circuit characteristics of said given test trace comprises selecting an amount of coupling area in which said given test trace and each of multiple ones of said signal traces overlap.

19. The method as recited in claim 15, wherein said tuning one or more circuit characteristics of said given test trace comprises selecting an amount of distance between said given test trace and each of multiple ones of said signal traces.

20. A device, comprising:
- a plurality of signal traces; and
- one or more test traces configured to capacitively couple to said plurality of signal traces;
- wherein a given one of the one or more test traces is physically arranged with respect to each of multiple ones of said plurality of signal traces to produce a bandpass frequency response of said given test trace including a passband and a stopband;
- wherein a detection frequency corresponding either to a test frequency driven on selected ones of said plurality of signal traces during a test mode of operation of said device, or to a selected harmonic of said test frequency, is included in said passband; and
- wherein said given test trace is further physically arranged to produce a degree of capacitive coupling with respect to each of said multiple ones of said plurality of signal traces such that said bandpass frequency response of said given test trace satisfies a specified transmission requirement at said detection frequency, while said degree of capacitive coupling also satisfies a specified constraint for signal degradation on said multiple ones of said signal traces.

* * * * *